(12) United States Patent
Yoneda

(10) Patent No.: US 8,946,080 B2
(45) Date of Patent: Feb. 3, 2015

(54) PATTERN TRANSFER METHOD

(75) Inventor: Ikuo Yoneda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 249 days.

(21) Appl. No.: 13/399,016

(22) Filed: Feb. 17, 2012

(65) Prior Publication Data

US 2012/0295435 A1    Nov. 22, 2012

(30) Foreign Application Priority Data

May 16, 2011    (JP) .................................. 2011-109572

(51) Int. Cl.
| | |
|---|---|
| H01L 21/4763 | (2006.01) |
| G03F 1/50 | (2012.01) |
| G03F 7/00 | (2006.01) |
| G03F 7/20 | (2006.01) |
| H01L 21/311 | (2006.01) |
| H01L 21/768 | (2006.01) |

(52) U.S. Cl.
CPC ................ *G03F 1/50* (2013.01); *G03F 7/0002* (2013.01); *G03F 7/2014* (2013.01); *H01L 21/311* (2013.01); *H01L 21/76807* (2013.01); *H01L 21/76817* (2013.01)
USPC .................................. 438/643; 257/E21.584

(58) Field of Classification Search
CPC ... G03F 1/50; G03F 7/0002; H01L 21/76817; H01L 21/311
USPC ....................................................... 438/643
See application file for complete search history.

(56) References Cited

U.S. PATENT DOCUMENTS

| | | | |
|---|---|---|---|
| 2006/0024619 A1* | 2/2006 | Tacken et al. .................. | 430/321 |
| 2007/0217075 A1* | 9/2007 | Kamata et al. ................. | 360/135 |
| 2008/0055581 A1* | 3/2008 | Rogers et al. .................. | 355/95 |

FOREIGN PATENT DOCUMENTS

| | | |
|---|---|---|
| JP | 2008-44289 | 2/2008 |
| JP | 4073343 | 2/2008 |
| JP | 2008-132722 | 6/2008 |
| JP | 2008-142915 | 6/2008 |
| JP | 2010-13513 | 1/2010 |
| JP | 2010-13514 | 1/2010 |
| JP | 2010-147085 | 7/2010 |
| JP | 2010-245130 | 10/2010 |

OTHER PUBLICATIONS

Notification of Reason for Rejection issued by the Japanese Patent Office on Feb. 14, 2014, for Japanese Patent Application No. 2011-109572, and English-language translation thereof.

* cited by examiner

*Primary Examiner* — Alexander Ghyka
(74) *Attorney, Agent, or Firm* — Finnegan, Henderson, Farabow, Garrett & Dunner, L.L.P.

(57) ABSTRACT

In one embodiment, a pattern transfer method includes forming a photoreactive resin on a substrate to be processed. The method further includes pressing a mold against the photoreactive resin, the mold including a transparent substrate having a concave-convex pattern, and a light-blocking film provided on a part of surfaces of the concave-convex pattern. The method further includes irradiating the photoreactive resin with light through the mold in a state in which the mold is pressed against the photoreactive resin. The method further includes baking the photoreactive resin in a state in which the mold is pressed against the photoreactive resin after irradiating the photoreactive resin with the light. The method further includes releasing the mold from the photoreactive resin after baking the photoreactive resin. The method further includes rinsing the photoreactive resin with a rinsing solution after releasing the mold.

19 Claims, 8 Drawing Sheets

PATTERN TRANSFER METHOD

CROSS REFERENCE TO RELATED APPLICATION

This application is based upon and claims the benefit of priority from the prior Japanese Patent Application No. 2011-109572, filed on May 16, 2011, the entire contents of which are incorporated herein by reference.

FIELD

Embodiments described herein relate to a pattern transfer method.

BACKGROUND

Recently, in a process of manufacturing a highly integrated LSI, a micro-optical device, a bio-related product or the like, techniques for performing a fine patterning process at low cost have become more and more important. Examples of the techniques include a nanoimprint technique.

In the nanoimprint technique, a mold (also referred to as stamper or template) having a concave-convex pattern is pressed against a resin on a substrate to be processed, thereby transferring the pattern onto the resin, and the mold is then released from the resin. However, the nanoimprint technique has a problem that a residual film (RLT) is generated in a concave portion of the resin when the mold is released from the resin.

The residual film can be removed by an etching process, for example, an anisotropic etching process with oxygen plasma or the like. However, in a case where the etching process is performed, there is a problem that the number of processes for the nanoimprinting is increased, so that it becomes difficult to reduce an equipment investment cost. This results in an increase of a cost for manufacturing the device to be processed.

Meanwhile, in the nanoimprint technique, a technique of transferring a pattern to a functional film whose material has a certain function has been developed to reduce a cost of the fine patterning process. However, in a case where the functional film is used, there is also a problem that a residual film is generated in a concave portion of the functional film.

DETAILED DESCRIPTION

Embodiments will now be explained with reference to the accompanying drawings.

An embodiment described herein is a pattern transfer method including forming a photoreactive resin on a substrate to be processed. The method further includes pressing a mold against the photoreactive resin, the mold including a transparent substrate having a concave-convex pattern, and a light-blocking film provided on a part of surfaces of the concave-convex pattern. The method further includes irradiating the photoreactive resin with light through the mold in a state in which the mold is pressed against the photoreactive resin. The method further includes baking the photoreactive resin in a state in which the mold is pressed against the photoreactive resin after irradiating the photoreactive resin with the light. The method further includes releasing the mold from the photoreactive resin after baking the photoreactive resin. The method further includes rinsing the photoreactive resin with a rinsing solution after releasing the mold.

First Embodiment

FIGS. 1A to 3C are side sectional views illustrating a pattern transfer method of a first embodiment. FIGS. 1A to 3C show a process for manufacturing a semiconductor device by nanoimprinting.

Figure 1A:
FIGS. 1A to 3C are side sectional views illustrating a pattern transfer method of a first embodiment.

First, as shown in FIG. 1A, a substrate 101 to be processed is prepared. The substrate 101 is a semiconductor substrate provided with semiconductor devices, for example.

Figure 1B:
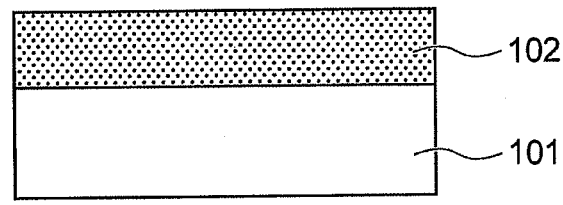

Next, as shown in FIG. 1B, a photoreactive resin 102 is coated on the substrate 101 by spin coating. The photoreactive resin 102 is a positive-type photoreactive insulating resin, for example. Examples of the photoreactive resin 102 include a chemically amplified resist film or a resist film other than the chemically amplified resist film. The photoreactive resin 102 may be formed by a coating method such as ink jetting depending on the physicality. The photoreactive resin 102 may be also a negative-type photoreactive insulating resin.

Figure 1C:
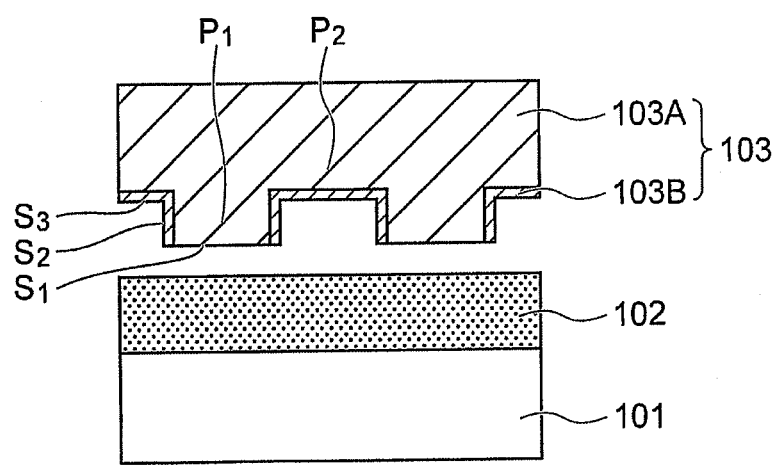

Next, as shown in FIG. 1C, the substrate 101 and a mold 103 for nanoimprinting are aligned with each other. The mold 103 has a concave-convex pattern of the same size as a processing pattern. The mold 103 has a transparent substrate 103A having the concave-convex pattern, and a light-blocking film 103B formed on a part of surfaces of the concave-convex pattern.

The transparent substrate 103A is composed of a base member made of quartz and a PDMS (polydimethylsilane) film attached to a surface of the base member and having the concave-convex pattern. The base member may be made of a porous material instead of quartz. In this case, there is an advantage that a solvent in the photoreactive resin 102 is easily evaporated since the solvent escapes from pores of the porous material during a baking process described below. The light-blocking film 103B is a metal film such as a chromium film, for example.

The transparent substrate 103A has a first portion $P_1$ which protrudes the most among substrate portions forming the concave-convex pattern, and a second portion $P_2$ which is depressed with respect to the first portion $P_1$. Reference character $S_1$ denotes a bottom surface of the first portion $P_1$, $S_2$ a side surface of the first portion $P_1$, and $S_3$ a bottom surface of the second portion $P_2$. The light-blocking film 103B is formed only on the side surface $S_2$ of the first portion $P_1$ and the bottom surface $S_3$ of the second portion $P_2$ among the surfaces $S_1$ to $S_3$. In other words, in the transparent substrate 103A, only a top portion of a convex portion of the concave-convex pattern opens from the light-blocking film 103B.

Figure 2A:
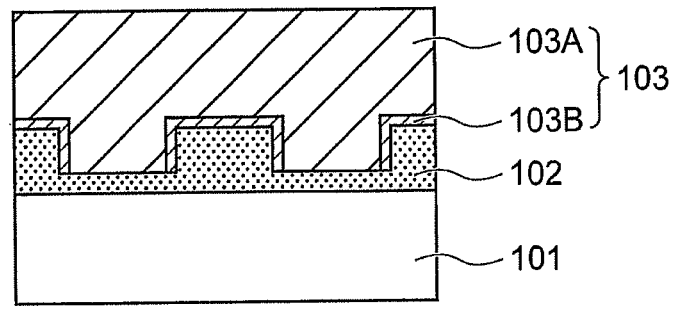

Next, as shown in FIG. 2A, the concave-convex pattern of the mold 103 is pressed against the photoreactive resin 102.

Figure 2B:
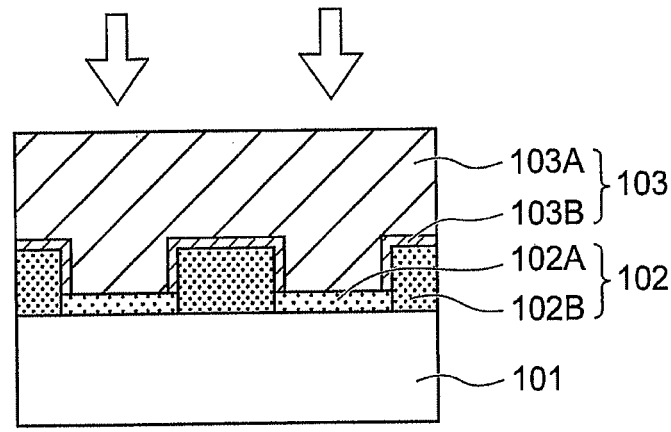

Next, as shown in FIG. 2B, the photoreactive resin 102 is irradiated with light (ultraviolet light) through the mold 103 in a state in which the mold 103 is pressed against the photoreactive resin 102. A light-receiving portion of the photoreactive resin 102 is exposed to light. A dissolution inhibiting group is thereby eliminated from molecules in the light-receiving portion.

In the present embodiment, the light-blocking film 103B is formed only on the surfaces $S_2$ and $S_3$ among the surfaces $S_1$ to $S_3$. Therefore, the light passes only through the surface $S_1$ of the surfaces $S_1$ to $S_3$. In the process in FIG. 2B, only a portion 102A of the photoreactive resin 102 facing the surface $S_1$ is exposed to light, and the other portion 102B is not exposed to light.

Figure 2C:
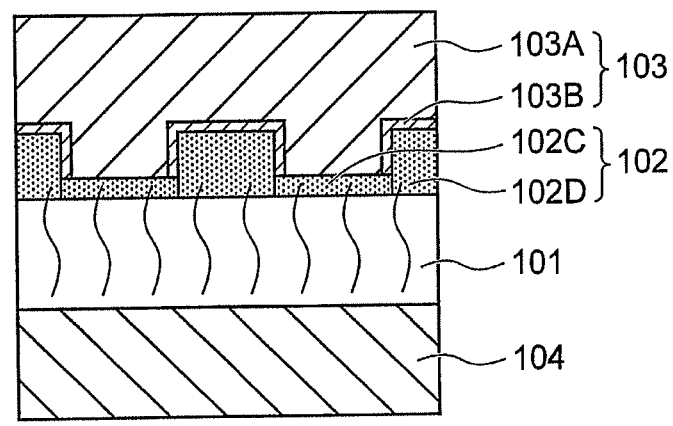

Next, as shown in FIG. 2C, the photoreactive resin 102 is baked in a state in which the mold 103 is pressed against the photoreactive resin 102. Accordingly, a solvent is removed from the photoreactive resin 102, so that the photoreactive resin 102 is cured. In FIG. 2C, the cured exposed portion 102A is denoted by reference character 102C, and the cured non-exposed portion 102B is denoted by reference character 102D. Reference numeral 104 denotes a baking device that bakes the substrate 101.

Figure 3A:
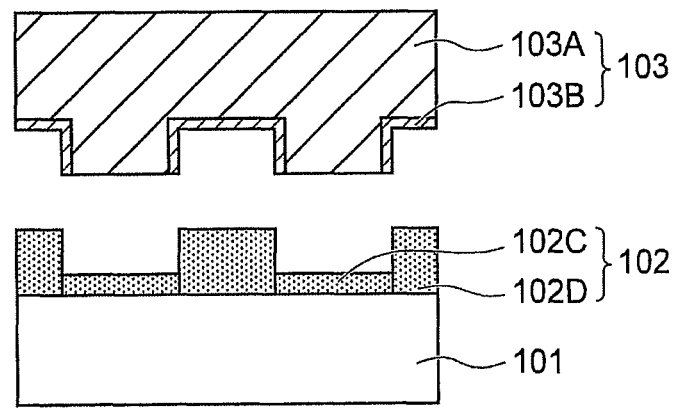

Next, as shown in FIG. 3A, the mold 103 is released from the photoreactive resin 102 after the photoreactive resin 102 is baked.

Figure 3B:
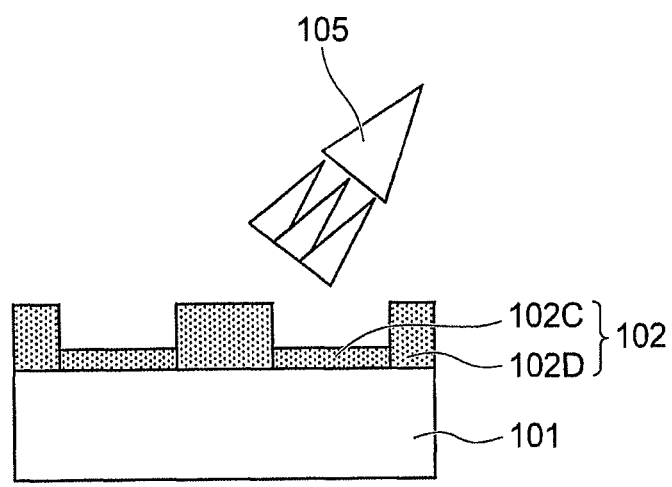

Next, as shown in FIG. 3B, the photoreactive resin 102 is rinsed with a rinsing solution after the mold 103 is released therefrom. The rinsing process in FIG. 3B corresponds to a developing process of the photoreactive resin 102. Reference numeral 105 denotes a rinsing device that rinses the photoreactive resin 102.

Examples of the rinsing solution include an alkaline developer, and an organic solvent. The alkaline developer is used when the photoreactive resin 102 is a chemically amplified resist film, for example. The organic solvent is used when the photoreactive resin 102 is a resist film other than the chemically amplified resist film, for example.

Figure 3C:
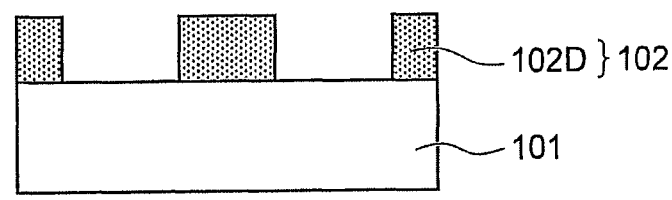

The photoreactive resin 102 in the present embodiment is a positive-type resin. Therefore, in the process in FIG. 3B, only the exposed portion 102C of the photoreactive resin 102 is soluble in the rinsing solution, and the non-exposed portion 102D of the photoreactive resin 102 remains. Accordingly, in the process in FIG. 3B, the exposed portion 102C of the photoreactive resin 102, i.e., a residual film (RLT) of the photoreactive resin 102 can be removed by the rinsing process (FIG. 3C).

As described above, as shown in FIG. 3C, a pattern composed of the non-exposed portion 102D of the photoreactive resin 102 is formed on the substrate 101. The pattern is used as a resist pattern for processing the substrate 101, for example.

(1) Examples of Mold 103

Figure 4A:
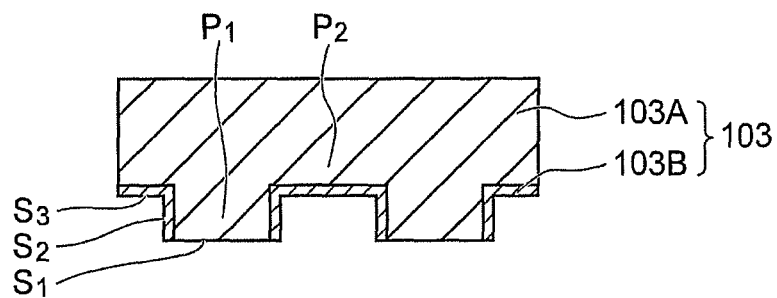
FIGS. 4A and 4B are side sectional views illustrating examples of a mold of the first embodiment.
Figure 4B:
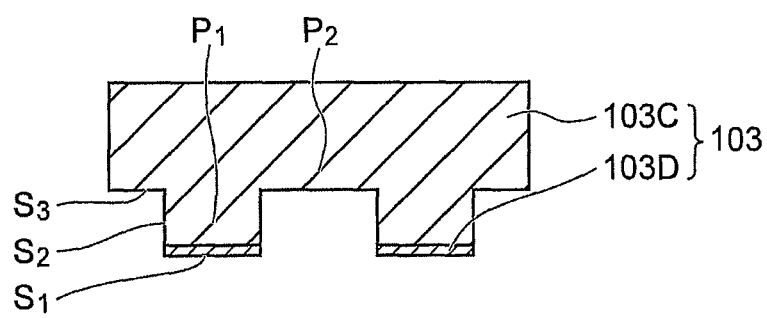

Next, examples of the mold 103 will be described by reference to FIGS. 4A and 4B. FIGS. 4A and 4B are side sectional views illustrating the examples of the mold 103 of the first embodiment.

In FIG. 4A, the light-blocking film 103B is formed only on the side surface $S_2$ of the first portion $P_1$ and the bottom surface $S_3$ of the second portion $P_2$ among the surfaces $S_1$ to $S_3$. Therefore, in the transparent substrate 103A in FIG. 4A, only the top portion of the convex portion of the concave-convex pattern opens from the light-blocking film 103B. This is the same as the case shown in FIGS. 1A to 3C.

Meanwhile, in FIG. 4B, the light-blocking film 103B is formed only on the bottom surface $S_1$ of the first portion $P_1$ among the surfaces $S_1$ to $S_3$. Therefore, in the transparent substrate 103A in FIG. 4B, only the top portion of the convex portion of the concave-convex pattern is covered with the light-blocking film 103B.

While the mold 103 in FIG. 4A is used when the photoreactive resin 102 is a positive-type resin, the mold 103 in FIG. 4B is used when the photoreactive resin 102 is a negative-type resin.

When the mold 103 in FIG. 4B is used and the negative-type resin is used as the photoreactive resin 102, only the portion 102B of the photoreactive resin 102 not hidden behind the surface $S_1$ is exposed to light and becomes hardly soluble in the rinsing solution in the process in FIG. 2B. The portion 102A hidden behind the surface $S_1$ is not exposed to light and remains easily soluble in the rinsing solution. Therefore, in the process in FIG. 3B, only the portion 102C hidden behind the surface $S_1$ is soluble in the rinsing solution, and the portion 102D not hidden behind the surface $S_1$ remains. Accordingly, in this case, the pattern shown in FIG. 3C is also formed on the substrate 101.

As described above, the pattern transfer method of the first embodiment can be achieved by using any of the molds 103 in FIG. 4A and FIG. 4B.

(2) Effects of First Embodiment

Finally, effects of the first embodiment will be described.

As described above, in the present embodiment, the mold 103 where the light-blocking film 103B is partially formed on the surface of the concave-convex pattern of the transparent substrate 103A is prepared. The mold 103 is pressed against the photoreactive resin 102. In this state, the photoreactive resin 102 is irradiated with light through the mold 103. Accordingly, only a part of the photoreactive resin 102 changes to be soluble in the rinsing solution.

Furthermore, in the present embodiment, the photoreactive resin 102 is baked with the mold 103 being pressed against the photoreactive resin 102 after the photoreactive resin 102 is irradiated with light. The photoreactive resin 102 is thereby cured.

Moreover, in the present embodiment, the mold 103 is released from the photoreactive resin 102 after the photoreactive resin 102 is baked. The photoreactive resin 102 is rinsed with the rinsing solution after the mold 103 is released. Accordingly, the residual film of the photoreactive resin 102 can be removed.

As described above, according to the present embodiment, the residual film of the photoreactive resin 102 can be removed by the rinsing process, not by an etching process. In a case where the etching process is performed, there is a problem that the number of processes of nanoimprinting is increased, and it becomes difficult to reduce an equipment investment cost. An etching device is a relatively expensive device. Therefore, it is not preferable to prepare the etching device for removing the residual film in view of costs. In the present embodiment, however, the etching process is not required. Accordingly, the number of processes of nanoimprinting can be decreased, and the equipment investment cost can be reduced. In the present embodiment, a cost of manufacturing a device to be processed can be thereby reduced.

As described above, according to the present embodiment, the residual film can be removed without performing the etching process.

In the following, a second embodiment as a modification of the first embodiment will be described with an emphasis on a difference from the first embodiment.

Second Embodiment

FIGS. 5A to 7C are side sectional views illustrating a pattern transfer method of the second embodiment. FIGS. 5A to 7C show a process for manufacturing a semiconductor device by nanoimprinting, similarly to FIGS. 1A to 3C.

Figure 5A:
FIGS. 5A to 7C are side sectional views illustrating a pattern transfer method of a second embodiment.

First, as shown in FIG. 5A, a substrate 201 to be processed is prepared. The substrate 201 is a semiconductor substrate provided with semiconductor devices, for example. FIG. 5A shows an inter layer dielectric 201A formed on the semiconductor substrate, and a conductive layer 201B formed in the inter layer dielectric 201A. The conductive layer 201B is a dual-damascene interconnect including a via plug layer and an interconnect layer.

Figure 5B:
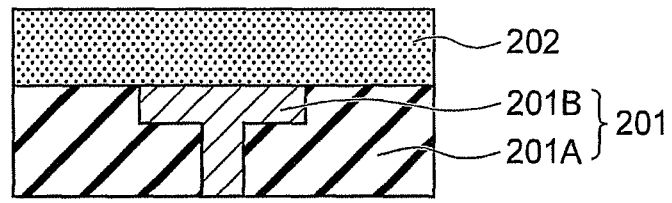

Next, as shown in FIG. 5B, a photoreactive resin 202 is coated on the substrate 201 by spin coating. The photoreactive resin 202 is a positive-type photoreactive insulating resin, for example. Examples of the resin include a sol-gel silicon oxide film-based resin.

Figure 5C:
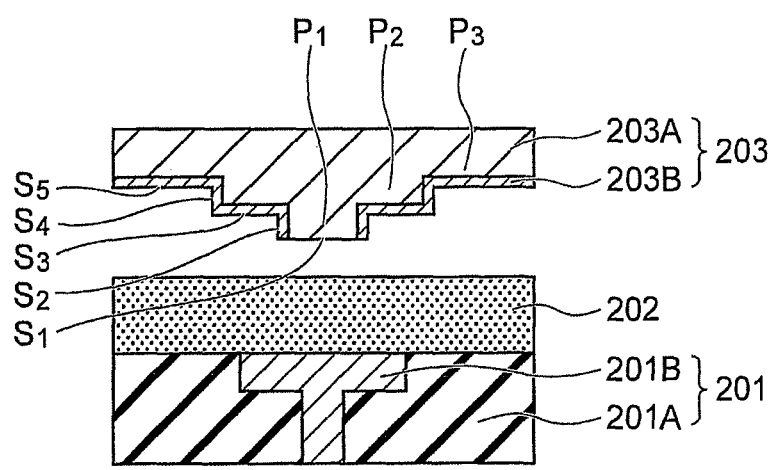

Next, as shown in FIG. 5C, the substrate 201 and a mold 203 for nanoimprinting are aligned with each other. The mold 203 has a concave-convex pattern of the same size as a processing pattern. The mold 203 has a transparent substrate 203A having the concave-convex pattern, and a light-blocking film 203B formed on a part of surfaces of the concave-convex pattern.

The transparent substrate 203A has a first portion $P_1$ which protrudes the most among substrate portions forming the concave-convex pattern, a second portion $P_2$ which is depressed with respect to the first portion $P_1$, and a third portion $P_3$ which is depressed with respect to the second portion $P_2$. Reference characters $S_1$ and $S_2$ respectively denote a bottom surface and a side surface of the first portion $P_1$, $S_3$ and $S_4$ a bottom surface and a side surface of the second portion $P_2$, and $S_5$ a bottom surface of the third portion $P_3$. The light-blocking film 203B is formed only on the surfaces $S_2$ to $S_5$, i.e., the surfaces other than the surface $S_1$ among the surfaces $S_1$ to $S_5$. In other words, in the transparent substrate 203A, only a top portion of a convex portion of the concave-convex pattern opens from the light-blocking film 203B.

Figure 6A:
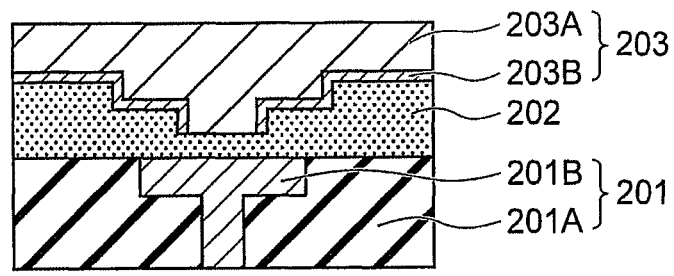

Next, as shown in FIG. 6A, the concave-convex pattern of the mold 203 is pressed against the photoreactive resin 202.

Figure 6B:
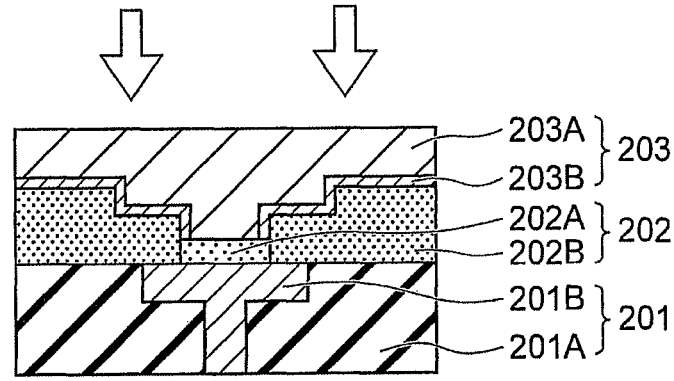

Next, as shown in FIG. 6B, the photoreactive resin 202 is irradiated with light (ultraviolet light) through the mold 203 in a state in which the mold 203 is pressed against the photoreactive resin 202. A light-receiving portion of the photoreactive resin 202 is exposed to light. A dissolution inhibiting group is thereby eliminated from molecules in the light-receiving portion.

In the present embodiment, the light-blocking film 203B is formed only on the surfaces $S_2$ to $S_5$ among the surfaces $S_1$ to $S_5$. Therefore, the light passes only through the surface $S_1$ of the surfaces $S_1$ to $S_5$. In the process in FIG. 6B, only a portion 202A of the photoreactive resin 202 facing the surface $S_1$ is exposed to light, and the other portion 202B is not exposed to light.

Figure 6C:
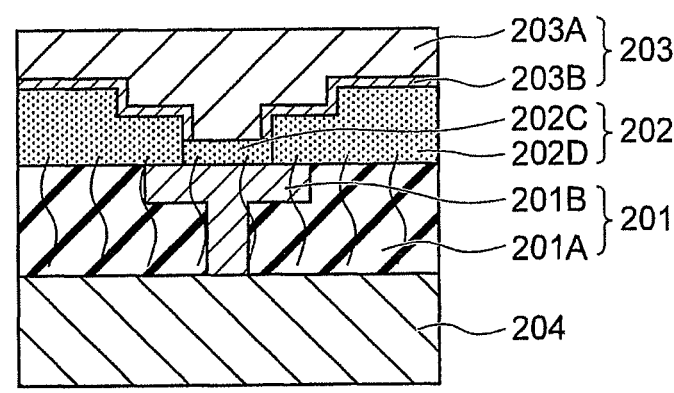

Next, as shown in FIG. 6C, the photoreactive resin 202 is baked in a state in which the mold 203 is pressed against the photoreactive resin 202. Accordingly, a solvent is removed from the photoreactive resin 202, so that the photoreactive resin 202 is cured. In FIG. 6C, the cured exposed portion 202A is denoted by reference character 202C, and the cured non-exposed portion 202B is denoted by reference character 202D. Reference numeral 204 denotes a baking device that bakes the substrate 201.

Figure 7A:
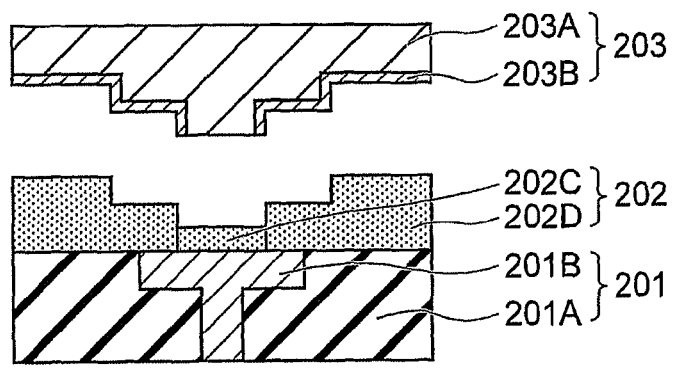

Next, as shown in FIG. 7A, the mold 203 is released from the photoreactive resin 202 after the photoreactive resin 202 is baked.

Figure 7B:
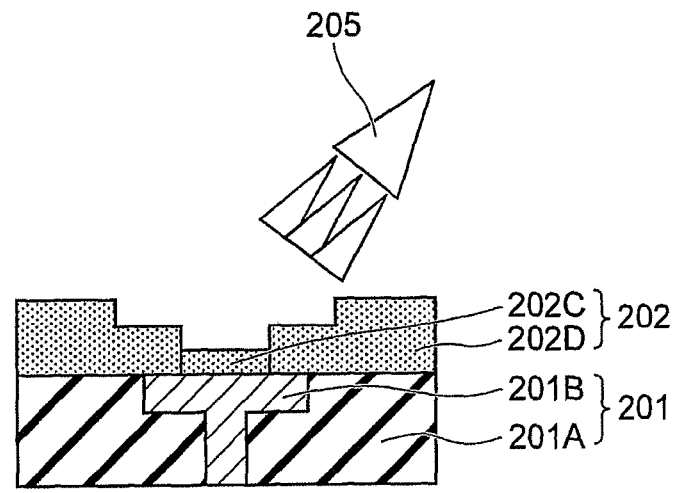

Next, as shown in FIG. 7B, the photoreactive resin 202 is rinsed with a rinsing solution after the mold 203 is released therefrom. The rinsing process in FIG. 7B corresponds to a developing process of the photoreactive resin 202. Reference numeral 205 denotes a rinsing device that rinses the photoreactive resin 202.

Figure 7C:
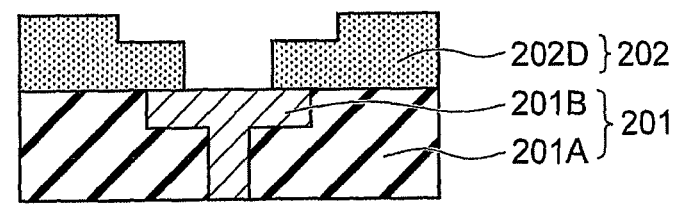

The photoreactive resin 202 in the present embodiment is a positive-type resin. Therefore, in the process in FIG. 7B, only the exposed portion 202C of the photoreactive resin 202 is soluble in the rinsing solution, and the non-exposed portion 202D of the photoreactive resin 202 remains. Accordingly, in the process in FIG. 7B, the exposed portion 202C of the photoreactive resin 202, i.e., a residual film (RLT) of the photoreactive resin 202 can be removed by the rinsing process (FIG. 7C).

As described above, as shown in FIG. 7C, a trench is formed in the photoreactive resin 202 on the substrate 201. The trench is formed at a position where an upper surface of the conductive layer 201B is exposed in the trench.

(1) Method of Using Photoreactive Resin 202

Next, a method of using the photoreactive resin 202 shown in FIG. 7C will be described.

In the present embodiment, the photoreactive resin 202 shown in FIG. 7C is used as an inter layer dielectric for allowing a dual-damascene interconnect to be buried in the trench. Within the trench, a deep trench formed by pressing the first portion $P_1$ is used as a via hole, and a shallow trench formed by pressing the second portion $P_2$ is used as an interconnect trench.

In the present embodiment, a conductive material is buried in the trench after the photoreactive resin 202 is rinsed. The conductive material is planarized by CMP (chemical mechanical polishing). The dual-damascene interconnect similar to the conductive layer 201B is thereby formed inside the trench. As the conductive material, a barrier metal material and an interconnect material are successively buried.

Next, an advantage of applying the present embodiment to a process of forming the dual-damascene interconnect will be described.

According to the present embodiment, the via hole and the interconnect trench can be formed by a single pressing process by using the mold 203 having the first to third portions $P_1$ to $P_3$. Meanwhile, when the via hole and the interconnect trench are formed by etching, etching needs to be performed twice to form the via hole and the interconnect trench. As described above, according to the present embodiment, the number of processes for forming the dual-damascene interconnect can be decreased, and a cost of manufacturing a device to be processed can be thereby reduced. The effect becomes more prominent as the number of interconnect layers is increased. Therefore, the method of the present embodiment is suitable for manufacturing a semiconductor device having many interconnect layers.

Also, in the present embodiment, the conductive layer formed inside the trench is electrically connected to the lower conductive layer 201B. In a case where the residual film 202C of the photoreactive resin 202 remains, the conductive layer in the trench is electrically insulated from the lower conductive layer 201B. In the present embodiment, however, the residual film 202C can be removed. Therefore, the conductive layer in the trench can be prevented from being electrically insulated from the lower conductive layer 201B.

As described above, in the present embodiment, the photoreactive resin 202 is used as the inter layer dielectric. Generally, a material having a relative permittivity of 4 or less is used as a material of the inter layer dielectric. Therefore, a relative permittivity of the photoreactive resin 202 is preferably 4 or less. The photoreactive resin 202 can be thereby caused to function similarly to a conventional inter layer dielectric.

(2) Examples of Mold 203

Figure 8A:
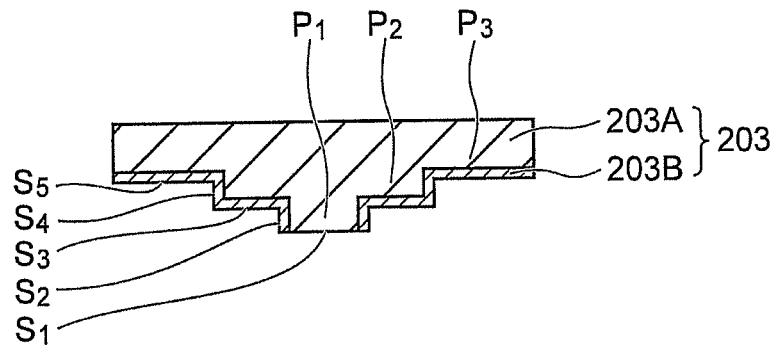
FIGS. 8A and 8B are side sectional views illustrating examples of a mold of the second embodiment.
Figure 8B:
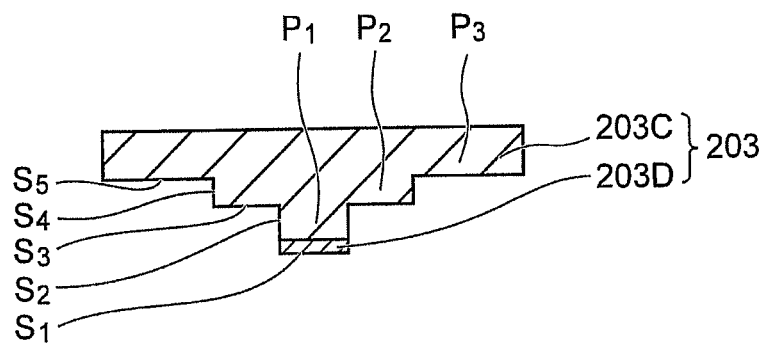

Next, examples of the mold 203 will be described by reference to FIGS. 8A and 8B. FIGS. 8A and 8B are side sectional views illustrating the examples of the mold 203 of the second embodiment.

In FIG. 8A, the light-blocking film 203B is formed only on the surfaces $S_2$ to $S_5$ among the surfaces $S_1$ to $S_5$. Therefore, in the transparent substrate 203A in FIG. 8A, only the top portion of the convex portion of the concave-convex pattern opens from the light-blocking film 203B. This is the same as the case shown in FIGS. 5A to 7C.

Meanwhile, in FIG. 8B, the light-blocking film 203B is formed only on the surface $S_1$ among the surfaces $S_1$ to $S_5$. Therefore, in the transparent substrate 203A in FIG. 8B, only the top portion of the convex portion of the concave-convex pattern is covered with the light-blocking film 203B.

While the mold 203 in FIG. 8A is used when the photoreactive resin 202 is a positive-type resin, the mold 203 in FIG. 8B is used when the photoreactive resin 202 is a negative-type resin. This is the same as the mold 103 in FIG. 4B in the first embodiment.

As described above, the pattern transfer method of the second embodiment can be achieved by using any of the molds 203 in FIG. 8A and FIG. 8B.

(3) Effects of Second Embodiment

Finally, effects of the second embodiment will be described.

According to the present embodiment, the residual film of the photoreactive resin 202 can be removed by the rinsing process, not by an etching process, in a similar manner to the first embodiment. In a case where the etching process is performed, there is a problem that the number of processes of nanoimprinting is increased, and it becomes difficult to reduce an equipment investment cost. An etching device is a relatively expensive device. Therefore, it is not preferable to prepare the etching device for removing the residual film in view of costs. In the present embodiment, however, the etching process is not required. Accordingly, the number of processes of nanoimprinting can be decreased, and the equipment investment cost can be reduced. In the present embodiment, a cost of manufacturing a device to be processed can be thereby reduced.

Also, in the present embodiment, the via hole and the interconnect trench for the dual-damascene interconnect are formed by using the mold 203 having the first to third portions $P_1$ to $P_3$. The via hole and the interconnect trench can be thereby formed by a single pressing process. Therefore, according to the present embodiment, the number of processes for forming the dual-damascene interconnect can be decreased, and the cost of manufacturing a device to be processed can be reduced. According to the present embodiment, the dual-damascene interconnects can be also prevented from being electrically insulated from each other due to the residual film.

As described above, according to the present embodiment, the residual film can be removed without performing the etching process in a similar manner to the first embodiment.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A pattern transfer method comprising:
forming a photoreactive resin on a substrate to be processed;
pressing a mold against the photoreactive resin, the mold including a transparent substrate having a concave-convex pattern, and a light-blocking film provided on a part of surfaces of the concave-convex pattern, the transparent substrate including a first portion protruding the most among substrate portions forming the concave-convex pattern, and a second portion depressed with respect to the first portion;
irradiating the photoreactive resin with light through the mold in a state in which the mold is pressed against the photoreactive resin;
baking the photoreactive resin in a state in which the mold is pressed against the photoreactive resin after irradiating the photoreactive resin with the light;
releasing the mold from the photoreactive resin after baking the photoreactive resin; and
rinsing the photoreactive resin with a rinsing solution after releasing the mold;
wherein
the light-blocking film is formed only on a bottom surface of the first portion among the bottom surface of the first portion, a side surface of the first portion, and a bottom surface of the second portion, so that only the side surface of the first portion and the bottom surface of the second portion are open from the light-blocking film among the bottom surface of the first portion, the side surface of the first portion, and the bottom surface of the second portion, or
the light-blocking film is formed only on the side surface of the first portion and the bottom surface of the second portion among the bottom surface of the first portion, the side surface of the first portion, and the bottom surface of the second portion, so that only the bottom surface of the first portion is open from the light-blocking film among the bottom surface of the first portion, the side surface of the first portion, and the bottom surface of the second portion.

2. The method of claim 1, wherein
the transparent substrate includes a first portion protruding the most among substrate portions forming the concave-convex pattern, a second portion depressed with respect to the first portion, and a third portion depressed with respect to the second portion, and
the light-blocking film is formed only on a bottom surface of the first portion, or only on surfaces other than the bottom surface of the first portion, among the bottom surface and a side surface of the first portion, a bottom surface and a side surface of the second portion, and a bottom surface of the third portion.

3. The method of claim 2, wherein
the photoreactive resin is an inter layer dielectric,
a trench formed by pressing the first portion against the photoreactive resin is a via hole, and
a trench formed by pressing the second portion against the photoreactive resin is an interconnect trench.

4. The method of claim 2, further comprising burying a conductive material in a trench formed by pressing the mold against the photoreactive resin, after rinsing the photoreactive resin.

5. The method of claim 4, wherein the trench is formed at a position where an upper surface of a conductive layer is exposed in the trench.

6. The method of claim 4, wherein the conductive material successively includes a barrier metal material and an interconnect material.

7. The method of claim 4, further comprising planarizing the conductive material to form a dual-damascene interconnect in the trench.

8. The method of claim 1, wherein the photoreactive resin is a positive-type or negative-type photoreactive insulating resin.

9. The method of claim 1, wherein the photoreactive resin is a resist film.

10. The method of claim 1, wherein the photoreactive resin is a sol-gel type resin.

11. The method of claim 1, wherein a relative permittivity of the photoreactive resin is 4 or less.

12. The method of claim 1, wherein the transparent substrate includes a base member formed of a porous material.

13. The method of claim 1, wherein the transparent substrate includes a base member formed of quartz.

14. The method of claim 1, wherein the transparent substrate includes a base member, and a film attached to a surface of the base member and having the concave-convex pattern.

15. The method of claim 14, wherein the film included in the transparent substrate is a polydimethylsilane film.

16. The method of claim 1, wherein the light-blocking film included in the mold is a metal film.

17. The method of claim 16, wherein the metal film is a chromium film.

18. The method of claim 1, wherein the light with which the photoreactive resin is irradiated is ultraviolet light.

19. The method of claim 1, wherein the rinsing solution is an alkaline developer or an organic solvent.

* * * * *